United States Patent [19]

Wittmer

[11] Patent Number: 4,669,877
[45] Date of Patent: Jun. 2, 1987

[54] DIGITAL GAIN CONTROLLED CURRENT TO VOLTAGE AMPLIFIER

[75] Inventor: Charles M. Wittmer, Trumbull, Conn.

[73] Assignee: The Perkin-Elmer Corporation, Norwalk, Conn.

[21] Appl. No.: 704,368

[22] Filed: Feb. 22, 1985

[51] Int. Cl.[4] .......................... G01J 3/42; H01J 39/12
[52] U.S. Cl. .................................. 356/300; 250/207; 250/214 AG; 356/326
[58] Field of Search .......................... 356/300, 319-334, 356/226, 250; 250/214 AG, 207; 330/85, 86, 282

[56] References Cited

U.S. PATENT DOCUMENTS

| | | | |
|---|---|---|---|
| 3,624,377 | 10/1971 | Zerkin | 356/325 |
| 3,664,743 | 5/1972 | Kanda | 356/325 |
| 3,714,441 | 1/1973 | Kreda | 250/214 AG X |
| 3,727,008 | 3/1973 | Fukuda et al. | 356/325 |
| 3,887,281 | 6/1975 | Kurita et al. | 356/325 |
| 3,967,113 | 6/1976 | Soodak et al. | 356/325 X |
| 4,133,008 | 1/1979 | Tisue | 250/214 AG X |
| 4,169,678 | 10/1979 | Inoue et al. | 356/321 |
| 4,227,811 | 10/1980 | Tohyama et al. | 356/325 |
| 4,279,510 | 7/1981 | Brown | 356/319 |
| 4,299,481 | 11/1981 | Chapman | 355/69 |
| 4,426,640 | 1/1984 | Becconsall et al. | 340/632 |

OTHER PUBLICATIONS

Mitra, "An Introduction to Digital and Analog Integrated Circuits and Applications", Harper & Row, 1980, pp. 236-237, 437-438, 474.

Primary Examiner—Vincent P. McGraw
Attorney, Agent, or Firm—Ronald G. Cummings; Francis L. Masselle; Edwin T. Grimes

[57] ABSTRACT

A digital gain controlled current to voltage amplifier having particular utility for interfacing with and forming part of a spectrophotometer system with a photomultiplier tube being responsive to light for producing an analog current proportional to the intensity thereof. The digital gain controlled current to voltage amplifier incorporates a current switched multiplying digital-to-analog converter inside its feedback loop. In this manner, the feedback loop impedance may be maintained constant as its gain is varied under control of a software programmed microcomputer.

8 Claims, 4 Drawing Figures

DIGITAL GAIN CONTROLLED CURRENT TO VOLTAGE AMPLIFIER

FIELD OF THE INVENTION

The present invention relates to a method and means for changing the signal gain of a spectrophotometer system and, more particularly, to a means for digital control of the system voltage gain without changing the resultant current at a virtual ground input to the preamplifier.

PRIOR ART STATEMENT

Typically, in a spectrophotometer system, a beam of light of a known frequency is transmitted through a sample and a photomultiplier tube is located to detect the light passing through the sample. The output of the photomultiplier tube is a current signal generally proportional to the light intensity being detected.

A preamplifier or operational amplifier is generally used to convert this current signal into a voltage signal. Typically, this signal is then coupled to a logarithmic amplifier to provide increased dynamic range. However, logarithmic amplifiers generally exhibit nonlinearity characteristics over the dynamic range of a spectrophotometer.

The following patents represent some of the prior art pertinent to the field of the present invention: U.S. Pat. No. 4,279,510 issued July 21, 1981 to James R. Brown; U.S. Pat. No. 4,227,811 issued Oct. 14, 1980 to Shigeo Tohyama et al; U.S. Pat. No. 3,887,281 issued June 3, 1975 to Takashi Kurita et al; U.S. Pat. No. 3,727,008 issued Mar. 27, 1973 to Kenji Fukuda et al; U.S. Pat. No. 4,169,678 issued Oct. 2, 1979 to Masaru Inoue et al; U.S. Pat. No. 3,664,743 issued May 23, 1972 to Kimio Kanda; U.S. Pat. No. 3,624,377 issued Oct. 30, 1971 to Milton Zerkin; U.S. Pat. No. 4,426,640 issued Jan. 17, 1984 to Jack K. Becconsall et al; and U.S. Pat. No. 4,299,481 issued Nov. 10, 1981 to Darwin E. Chapman.

In contrast to the prior art, the present invention provides a digital gain controlled current to voltage (pre) amplifier having a feedback loop which incorporates a current switched multiplying digital-to-anlog converter to enable the gain of a spectrophotometer system to be changed, for a large dynamic range and with relative good linearity, at the preamplifier performing the signal current to signal voltage translation. Another feature of this invention is that the feedback loop impedance is maintained substantially constant as the gain is changed, thereby minimizing voltage drift associated with amplifier output and it also allows faster settling time of the amplifier because the virtual ground input is continuously maintained during a gain change.

SUMMARY OF THE INVENTION

Generally speaking, in accordance with the invention, a digital gain controlled current to voltage amplifier is provided having particular utility for being interfaced with the photomultiplier tube signal current output of a spectrophotometer, comprising:
  amplifier circuit means 17 operatively coupled and responsive to the photomultiplier tube signal current output for providing a signal voltage translation thereof;
  feedback circuit means 18, 19, 20, R1 to enable a selective change of the gain of said amplifier circuit means without or virtually no change in the voltage and resultant current at the (virtual ground potential) input 16 of said amplifier circuit means.

Another feature of the above described digital gain controlled current to voltage amplifier 10 is the use of a microcomputer/microprocessor 20 controlled current switched multiplying digital-to-analog converter 19 within the feedback circuit means of the transconductance amplifier.

Accordingly, it is an object of the present invention to provide a new and novel amplifier circuit.

It is a further object of the present invention to provide a new and improved preamplifier for a spectrophotometer.

It is a further object of the present invention to provide an amplifier circuit having a feedback loop such that the voltage gain may be changed without changing the feedback input voltage or feedback current.

It is a further object of the present invention to provide an amplifier circuit having a feedback loop that utilizes a multiplying digital-to-analog converter.

It is a further object of the present invention to provide a digital gain controlled current to voltage amplifier.

It is a further object of the present invention to provide a circuit for a spectrophotometer to enable the instruments electronic system gain to be changed for a large dynamic range at the preamplifier performing a current to voltage translation for optimum overall performance.

BRIEF DESCRIPTION OF THE DRAWING

Other objects and advantages of the present invention will be evident from the following detailed description when read in conjunction with the accompanying drawings which illustrate the preferred embodiment of the present invention. Similar reference numerals refer to similar parts throughout.

DESCRIPTION OF THE PREFERRED EMBODIMENT

Figure 1:
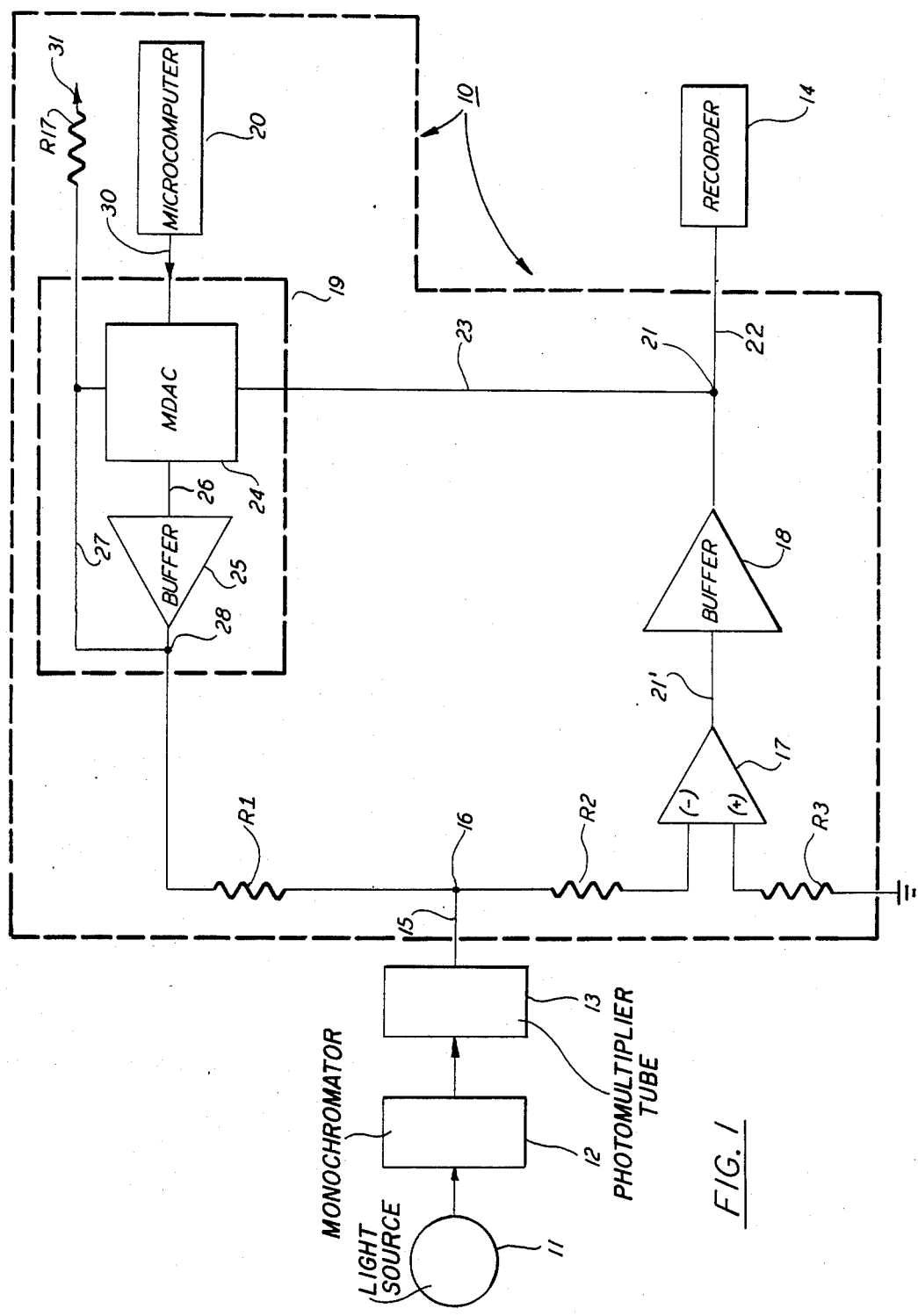
FIG. 1 is a block diagram of an embodiment of a spectrophotometer system having an amplifier network according to the invention.

With reference now to FIG. 1, there is shown a block diagram of a spectrophotometric measurement system which, in accordance with the invention, incorporates the preferred embodiment of the digital gain controlled current to voltage amplifier 10.

Since light source 11, spectrophotometer or monochromator 12, photomultiplier tube 13 and recorder 14 may be of conventional design, exhaustive discussion of these items will not be provided herein to avoid prolixity.

Briefly stated, however, light source 11 may comprise a hollow cathode lamp, electrodeless discharge lamp, inductively coupled plasma, tungsten lamp or deutrium lamp. Spectrophotometer or monchromator 12 generally has an entrance slit, a dispersion element such as a prism or a grating, an exit slit and mirrors. Depending on the arrangement of the dispersion elements, a collimating mirror, and a camera mirror, the monchromator is generally classified as a Littrow type or an Ebert type monochromator. The light from the monochromator 12 is converted to a current signal having a value corresponding to and being indicative of the incident light upon photomultiplier tube 13.

In accordance with the present invention, the output current signal from photomultiplier tube 13 is coupled, via lead 15, to the virtual ground input or junction point 16 of digital gain controlled current to voltage amplifier 10.

Digital gain controlled current to voltage amplifier 10 basically comprises operational amplifier 17, buffer amplifier 18, multiplying digital-to-analog converter network (MDAC) 19, feedback resistor R1 and microcomputer 20.

Operational amplifier 17 functions to convert the current signal output of photomultiplier tube 13 into a voltage signal. Operational amplifier 17 has inverting (−) and noninverting (+) inputs, and an output coupled via lead 21' to the input of buffer amplifier 18. The current signal is coupled to the inverting input of operational amplifier 17 via lead 15, junction point 16 and input resistor R2. Resistor R3 basically functions as a bias resistor. A capacitor (not shown in FIG. 1) is operatively connected between the inverting input and the output for stabilizing feedback loop gain.

Buffer amplifier 18 serves to isolate junction point 21 from the output of operational amplifier 17, and to maintain the impedance at junction point 21 and, thereby, the input impedance Zin to MDAC 19, at a virtual zero impedance level. In this manner, the open loop output impedance of operation amplifier 17 is buffered, which enables the loop gain feedback of current to voltage amplifier 10 to be maintained at a substantially constant predetermined value. The output voltage signal of buffer amplifier 18 is coupled, via junction point 21 and leads 22, 23, respectively, to recorder or readout device 14 and MDAC 19.

Multiplying digital-to-analog converter network 19 may comprise a conventional multiplying DAC device 24, for example, the AD7541A available from Analog Devices, and a buffer amplifier 25. Multiplying DAC 24 is a current switched device being operated in a stepped down or digital attenuation mode such that its impedance substantially does not change with attenuation. The output voltage signal of buffer amplifier 18 is coupled, as noted above, to the voltage reference terminal of Multiplying DAC device 24 via lead 23. The output(s) of multiplying DAC 25 is/are coupled to the input of buffer amplifier 25 via lead 26. Buffer amplifier 25 may comprise an operational amplifier connected in a closed loop configuration, via lead 27 and a feedback resistor (not shown) within multiplying DAC 24, to its inverting input (not shown). The output of buffer amplifier 25 is connected to junction point 28 which is the (virtually-fixed) feedback reference voltage point of the current to voltage amplifier loop.

Feedback resistor R1 is connected between junction point 28 and, via junction point 16, to the inverting input (−) of operational amplifier 17.

Microcomputer or microprocessor 20 which may be of conventional design is operatively connected via lead 30 to the control inputs of multiplying DAC 24. Microcomputer 20 may be programmed, for example, with appropriate software instructions to select the desired gain of current to voltage amplifier 10. It should be understood at this time that microcomputer 20 may be replaced by other control means such as a digital switch network (not shown).

Operation

The basic operation of the digital gain controlled current to voltage amplifier 10 within a spectrophotometer system, in accordance with the invention, will now be discussed with reference to FIG. 1 and table 1 below. Table 1 is a chart corresponding the selected or digital control gain G to the reference voltage $V_f$ at junction point 28 and the output voltage signal $V_o$ at junction point 21.

TABLE I

| G | $V_f$ | $V_o$ |
|---|---|---|
| 1 | $V_f = V_o$ | $V_o = V_f$ |
| 2 | $V_o/2$ | $V_o$ |
| 4 | $V_o/4$ | $V_o$ |
| 8 | $V_o/8$ | $V_o$ |
| 16 | $V_o/16$ | $V_o$ |

It should be readily understood from the above that the digital control is being set to, for example, binary values. The reference voltage $V_f$ is being represented as a binary fraction of the output voltage $V_o$ since, as noted above, multiplying DAC 24 is operated in a stepped down or digital attenuation mode.

With light source 11 providing light to monochromator 12, which is coupled to photomultiplier tube 13, a current signal is provided, via circuit junction point 16, to the inverting input of operational amplifier 17.

For ease of understanding, it will also be assumed that the feedback voltage $V_f$ (not shown) at circuit junction point 28, for a programmed gain of 1, is at a (virtually fixed) level of 0.5 volts, with a current $I_f$ (not shown) through feedback resistor R1 being 0.5 microamps. Feedback current $I_f$ is equal in magnitude to the input current from photomultiplier tube 13 with a 180 degree steady-state phase shift. This signal is detected by the open loop inverting-noninverting input configuration of operational amplifier 17 and converted to a voltage signal output coupled, via lead 21, to the input of buffer amplifier 18.

Buffer amplifier 18, in turn, provides a corresponding buffered voltage signal output $V_o$, via circuit junction point 21, to recorder 14 and MDAC 19.

The level of output signal voltage $V_o$ may be determined with reference to Table 1 above. For example, if microcomputer 20 is programmed to provide a gain of 1 command to multiplying DAC 24, the voltage output $V_o$ will equal $V_f$, i.e., 0.5 volt.

With the same current signal from photomultiplier tube 13 and a gain command signal of 2 from microcomputer 20, MDAC 19 detects a low $V_o$ voltage at circuit junction point 21 and in response thereto provides a (slight) voltage change $V_c$ (not shown) at circuit junction point 28. This (slight) voltage change $V_c$ is coupled via feedback resistor R1 and circuit junction point 16 to the inverting input of operational amplifier 17. It being understood that this voltage change $V_c$ is infinitesimal so as to maintain circuit junction point 16 at a virtual ground potential. Notwithstanding, voltage change $V_c$ is detected across the open loop inverting-noninverting input configuration of operational amplifier 17, which in response thereto effects an increased voltage output signal to buffer amplifier 18 and, in turn, to circuit junction point 21.

The output voltage $V_o$ at circuit point 21 is monitored by MDAC 19, via lead 23, so as to effect the appropriate voltage change $V_c$ across the open loop configuration of operational amplifier 17 to obtain the increased voltage output $V_o$.

With a gain of 2 command, voltage output is equal to the (virtually) fixed voltage $V_f$ (it being understood that voltage change $V_c$ is infinitesimal) multiplied by the gain factor, i.e., (0.5) (2)=1 volt.

The same analysis can be applied to each of the examples set forth in Table 1, but will not be demonstrated herein to avoid prolixity.

As can now be recognized, the spectrophotometer system, in accordance with the present invention, effects a change of the systems gain for a large dynamic range at the preamplifier 17 performing the current to voltage translation and thereby, provides a substantially improved overall performance. Also, systems voltage gain may be varied with (virtually) no voltage input change to feedback resistor R1 and with the resultant current input to circuit junction point 16, i.e., the virtual ground junction, being (virtually) unchanged.

An additional feature of the preferred embodiment of the invention is the provision of a nonautomatic gain control output 31 which tracks the signal at circuit junction point 16 as an analog output. Resistor device R17 serves as a real time isolation output resistor.

Figure 2A:
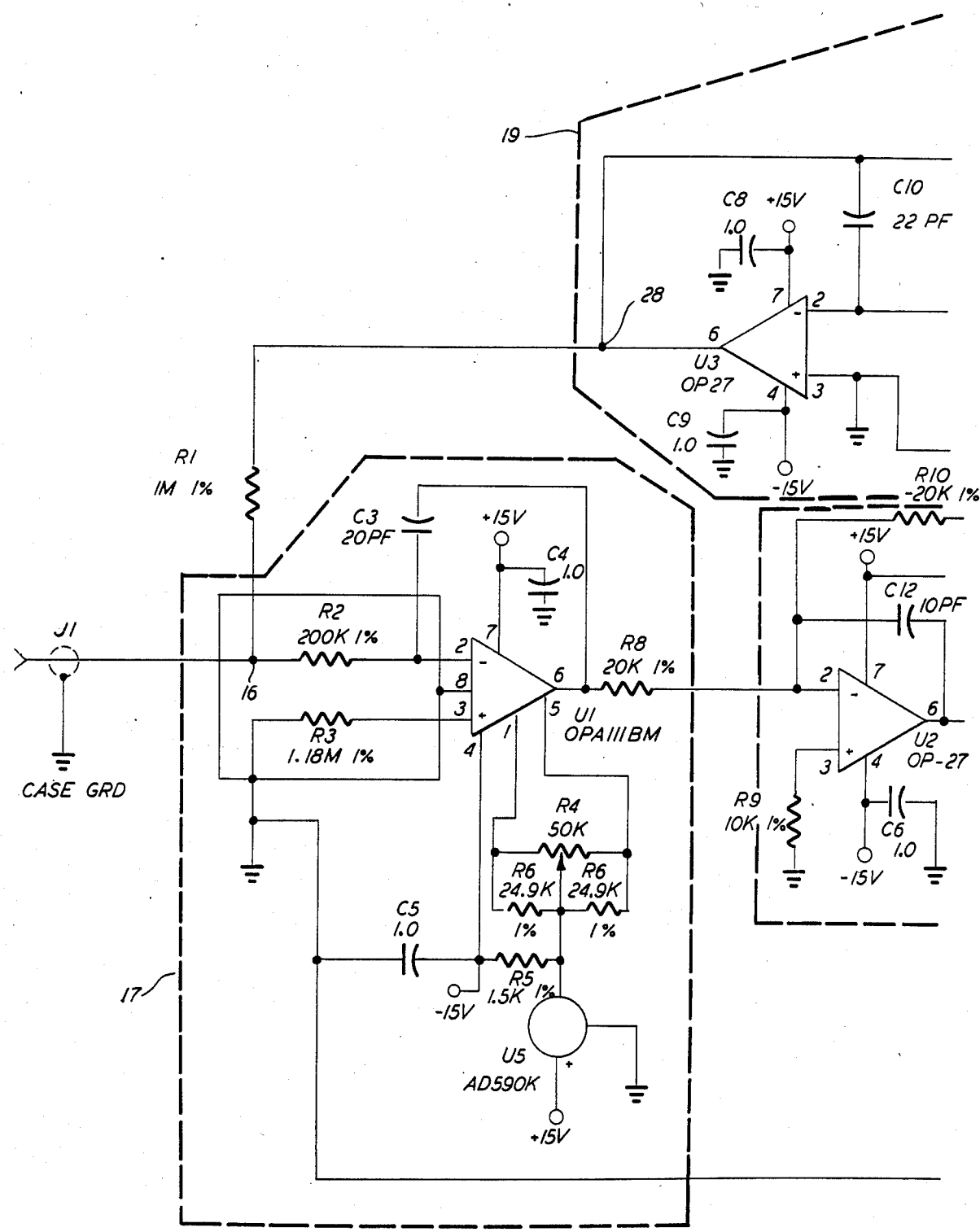
FIGS. 2A and 2B are complementary circuit diagram portions which together form the circuit diagram of the digital gain controlled current to voltage amplifier illustrated in FIG. 1.
Figure 2B:
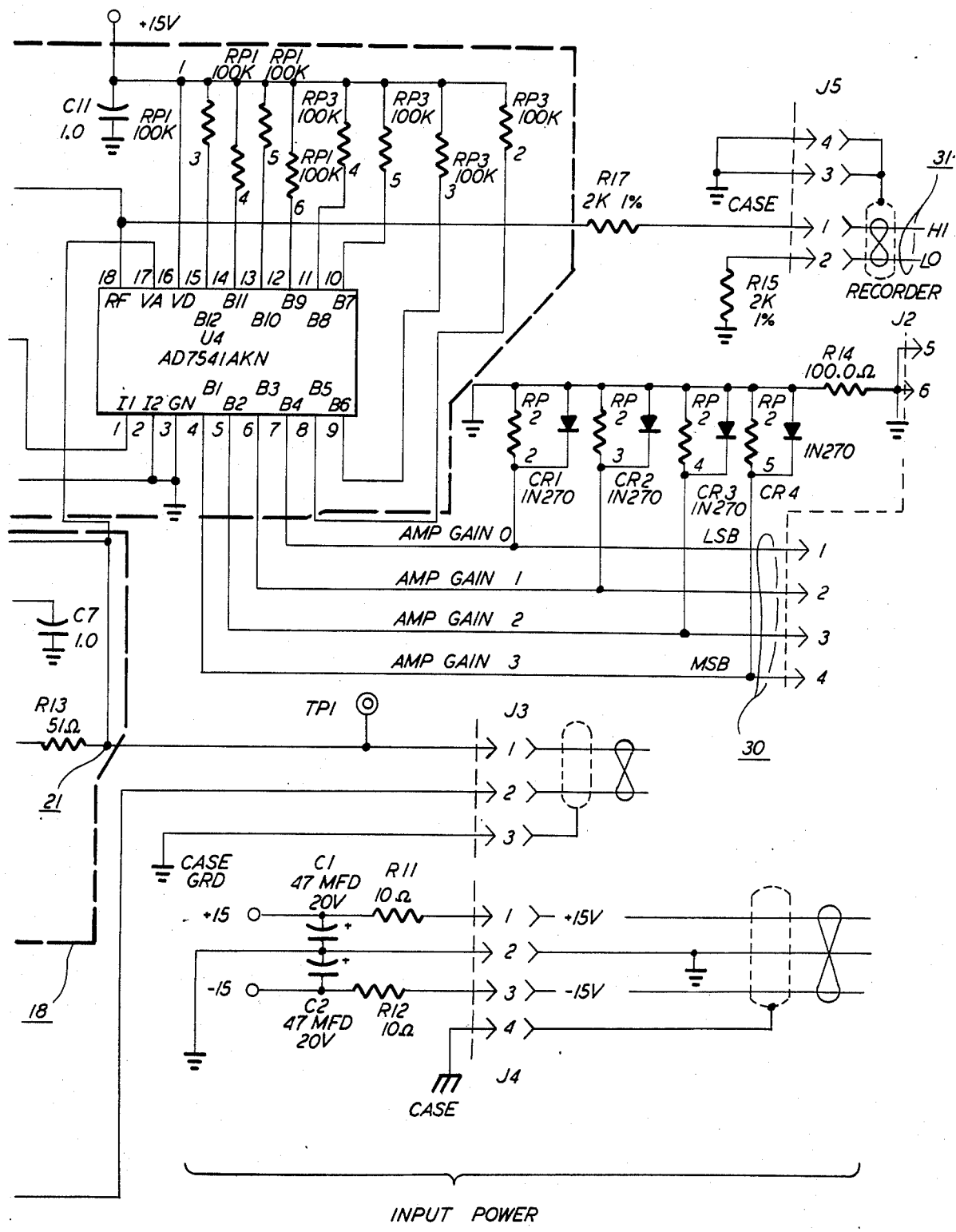

For those having particular interest in the specific circuit details of operation amplifier 17, buffer amplifier 18, and MDAC 19, reference may be made to FIGS. 2A and 2B which illustrates the preferred circuit embodiment of these functional components of the invention. It being understood, as noted above, that light source 11, spectrophotometer 12, photomultiplier tube 13, recorder 14 and microcomputer 20 may be of conventional design.

It is to be understood that the above described embodiment is illustrative of the application of the principles of the present invention. Other arrangements may be devised by those skilled in the art without departing from the spirit and scope of the claimed invention.

What is claimed is:

1. A spectrophotometer system comprising:
   means for producing light energy for spectrophotometry analysis;
   monochromator means operatively coupled to said light producing means for selecting light having a frequency band;
   photomultiplier tube means responsive to said frequency band for producing a current signal corresponding thereto;
   indicator means for indicating the response of said photomultiplier tube to said frequency band; and
   amplifier circuit means interconnecting said photomultiplier tube means and said indicator means comprising:
      current-to-voltage amplifier means having an output connected to said indicator means and an input interconnected to a virtual ground point, said photomultiplier tube means having a current signal output connected to said virtual ground;
      current switched multiplying digital-to-analog converter means for forming a feedback loop with constant feedback loop impedance, said converter means having:
         a voltage reference input connected to said output of said current-to-voltage amplifier means;
         a gain control input for receiving digital gain control signals to slectively vary the gain of the amplifier circuit means; and
         a feedback output interconnected to said virtual ground point; and
      digital control means for providing digital gain command signals to said converter means, said digital control means being connected to said gain control input of said converter means.

2. The device of claim 1 wherein said digital control means comprises a software programmable microcomputer.

3. The device of claim 1 wherein said current switched converter means comprises a multiplying digital-to-analog converter element configured in a digital attenuation mode so that its impedance is substantially constant with attenuation, said converter element having an output, and a buffer amplifier connected to said converter element output to interconnect said converter element to said virtual ground point.

4. The device of claim 3 wherein said buffer amplifier comprises an operational amplifier interconnected in a closed loop configuration with a feedback resistor to its inverting input.

5. The device of claim 1 wherein said current-to-voltage amplifier means comprises an operational amplifier having an inverting input, a noninverting input and an output with said inverting input being interconnected by a first resistor to said virtual ground point and said noninverting input being interconnected to a circuit ground by a second resistor, said feedback output of said converter means being interconnected to said virtual ground point by a feedback resistor with said feedback resistor and said first resistor having a combined resistance value approximately equal to the resistance value of said second resistor.

6. The device of claim 1 wherein said current-to-voltage amplifier means comprises an operational amplifier having an open loop feedback configuration with an inverting input, a noninverting input, and an output, said inverting input being interconnected by an input resistor to said virtual ground point and the output of said photomultiplier tube means and said noninverting input being interconnected by a bias resistor to a circuit ground point, and a buffer amplifier connected to said output of said operational amplifier and having an output connected to said voltage reference input of said converter means.

7. The device of claim 6 wherein said buffer amplifier is configured to isolate the voltage reference input of said converter means from the output of said operational amplifier to maintain the input impedance to said converter means at a virtual zero impedance level.

8. The device of claim 1 comprising output means connected to said feedback output of said converter means for tracking the output of said converter means as a analog signal for nonautomatic gain control.

* * * * *